(12) United States Patent
Sreenivasan et al.

(10) Patent No.: US 8,066,930 B2
(45) Date of Patent: Nov. 29, 2011

(54) FORMING A LAYER ON A SUBSTRATE

(75) Inventors: Sidlgata V. Sreenivasan, Austin, TX (US); Michael P. C. Watts, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/749,552

(22) Filed: Mar. 30, 2010

(65) Prior Publication Data

US 2010/0181289 A1 Jul. 22, 2010

Related U.S. Application Data

(63) Continuation of application No. 10/264,926, filed on Oct. 4, 2002, now abandoned.

(51) Int. Cl.
*B29C 41/12* (2006.01)
*B81C 1/00* (2006.01)

(52) U.S. Cl. ............ 264/319
(58) Field of Classification Search ............ 264/319
See application file for complete search history.

(56) References Cited

U.S. PATENT DOCUMENTS

| | | | |
|---|---|---|---|
| 6,334,960 B1 * | 1/2002 | Willson et al. | 216/52 |
| 6,517,995 B1 * | 2/2003 | Jacobson et al. | 430/320 |
| 6,861,365 B2 * | 3/2005 | Taussig et al. | 438/725 |

* cited by examiner

*Primary Examiner* — Leo B Tentoni
(74) *Attorney, Agent, or Firm* — Cameron A. King

(57) ABSTRACT

The present invention is directed to a method of forming an imprinting layer on a substrate including high resolution features, and transferring the features into a solidified region of the substrate. Desired thickness of the residual layer may be minimized in addition to visco-elastic behavior of the material.

20 Claims, 5 Drawing Sheets

FORMING A LAYER ON A SUBSTRATE

CROSS REFERENCE TO RELATED APPLICATIONS

This application is a Continuation of U.S. patent application Ser. No. 10/264,926 filed on Oct. 4, 2002 (now abandoned), which is hereby incorporated by reference.

BACKGROUND INFORMATION

The field of invention relates generally to imprint lithography. More particularly, the present invention is directed to forming layers on a substrate to facilitate fabrication of high resolution patterning features suited for use as metrology standards.

Metrology standards are employed in many industries to measure the operation of varying equipment and processes. For semiconductor processes, a typical metrology standard may include grating structures, L-shaped structures and other common patterning geometries found on production devices. In this manner, the metrology standards facilitate measurement of the performance of the processing equipment.

Conventional metrology standards are manufactured from a variety of conventional processes, such as e-beam lithography, optical lithography, and using various materials. Exemplary materials include insulative, conductive or semiconductive materials. After formation of the metrology standards using conventional processes, a post process characterization technique is employed to measure the accuracy of the metrology features. This is due, in part, to the difficulty in repeatably producing reliable accurate metrology standards. A drawback with the conventional processes for manufacturing metrology standards is that the post process characterization step is time consuming. In addition, the difficulty in repeatably producing reliable metrology standards results in a low yield rate. A processing technique that may prove beneficial in overcoming the drawbacks of the conventional processes for fabricating metrology standards is known as imprint lithography.

An exemplary imprint lithography process is disclosed in U.S. Pat. No. 6,334,960 to Willson et al. Willson et al. disclose a method of forming a relief image in a structure. The method includes providing a substrate having a planarization layer. The planarization layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the planarization layer that contains a relief structure complimentary to that of the mold. The mold is then separated from the solid polymeric material such that a replica of the relief structure in the mold is formed in the solidified polymeric material. The planarization layer and the solidified polymeric material are subjected to an environment to selectively etch the planarization layer relative to the solidified polymeric material such that a relief image is formed in the planarization layer. Advantages with this imprint lithography process are that it affords fabrication of structures with minimum feature dimensions that are far smaller than is provided employing standard semiconductor process techniques.

It is desired, therefore, to provide a method for reliably producing precision features on a substrate for use as metrology standards.

DETAILED DESCRIPTION OF THE PREFERRED EMBODIMENTS

Figure 1:
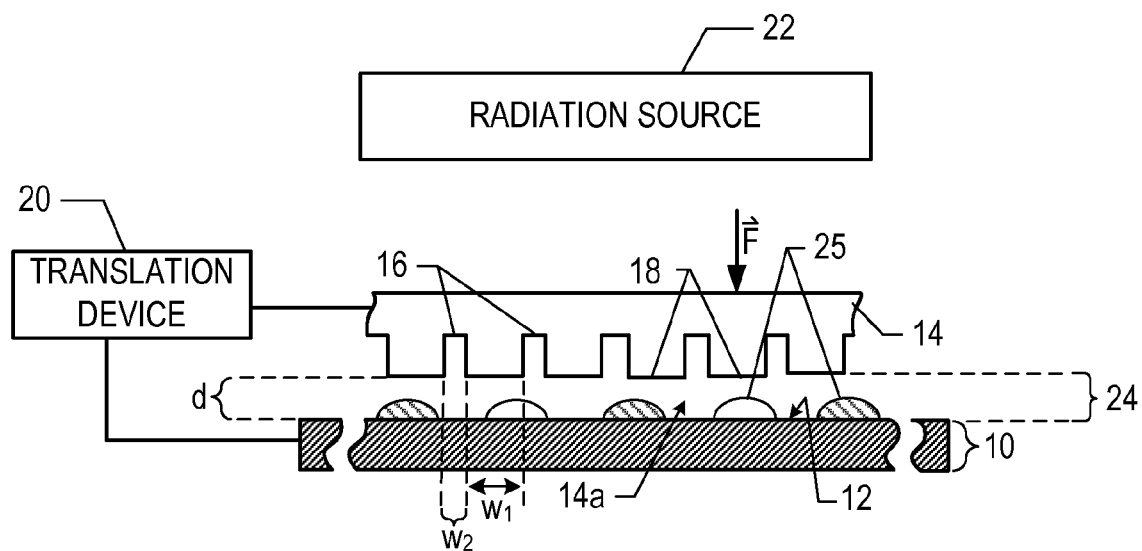
FIG. 1 is a simplified elevation view of a lithographic system in accordance with the present invention.

Referring to FIG. 1, a lithographic system in accordance with an embodiment of the present invention includes a substrate 10, having a substantially planar region shown as surface 12. Disposed opposite substrate 10 is an imprint device, such as a mold 14, having a plurality of features thereon, forming a plurality of spaced-apart recessions 16 and protrusions 18. In the present embodiment, recessions 16 are a plurality of grooves extending along a direction parallel to protrusions 18 that provide a cross-section of mold 14 with a shape of a battlement. However, recessions 16 may correspond to virtually any feature required to create an integrated circuit. A translation device 20 is connected between mold 14 and substrate 10 to vary a distance "d" between mold 14 and substrate 10. A radiation source 22 is located so that mold 14 is positioned between radiation source 22 and substrate 10. Radiation source 22 is configured to impinge radiation on substrate 10. To realize this, mold 14 is fabricated from material that allows it to be substantially transparent to the radiation produced by radiation source 22.

Figure 2:
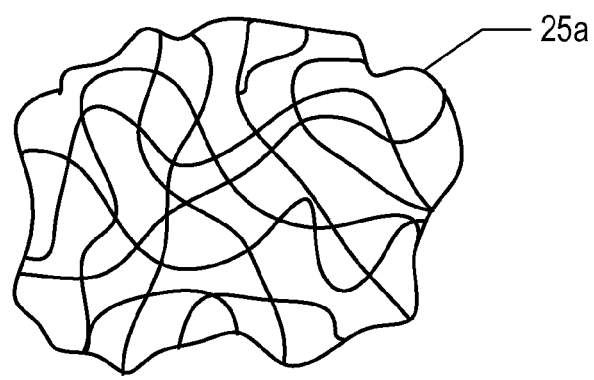
FIG. 2 is a simplified representation of material from which an imprinting layer, shown in FIG. 1, is comprised before being polymerized and cross-linked.

Referring to both FIGS. 1 and 2, a flowable region, such as an imprinting layer 24, is disposed formed on surface 12. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835-837, June 2002. In the present embodiment, however, flowable region is formed using imprint lithography. Specifically, flowable region consists of imprinting layer 24 deposited as a plurality of spaced-apart discrete beads 25 of material 25a on substrate 10, discussed more fully below. Imprinting layer 24 is formed from a material 25a that may be selectively polymerized and cross-linked to record a desired pattern. Material 25a is shown in FIG. 3 as being cross-linked at points 25b, forming cross-linked polymer material 25c.

Figure 4:
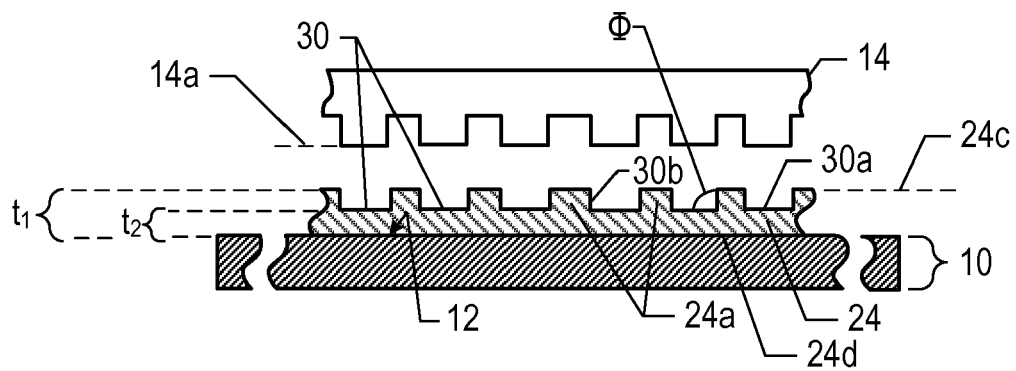
FIG. 4 is a simplified elevation view of the mold spaced-apart from the imprinting layer, shown in FIG. 1, after patterning of the imprinting layer.

Referring to FIGS. 1, 2 and 4, the pattern recorded by imprinting layer 24 is produced, in part, by mechanical contact with mold 14. To that end, translation device 20 reduces the distance "d" to allow imprinting layer 24 to come into mechanical contact with mold 14, spreading beads 25 so as to form imprinting layer 24 with a contiguous formation of material 25a over surface 12. In one embodiment, distance "d" is reduced to allow sub-portions 24a of imprinting layer 24 to ingress into and fill recessions 16.

To facilitate filling of recessions 16, material 25a is provided with the requisite properties to completely fill recessions while covering surface 12 with a contiguous formation of material 25a. In the present embodiment, sub-portions 24a of imprinting layer 24 in superimposition with protrusions 18 remain after the desired, usually minimum distance "d", has been reached, leaving sub-portions 24a with a thickness $t_1$, and sub-portions 24b with a thickness, $t_2$. Thicknesses "$t_1$" and "$t_2$" may be any thickness desired, dependent upon the application. Typically, $t_1$ is selected so as to be no greater than twice width u of sub-portions 24a, i.e., $t_1 \leq 2u$.

Figure 3:
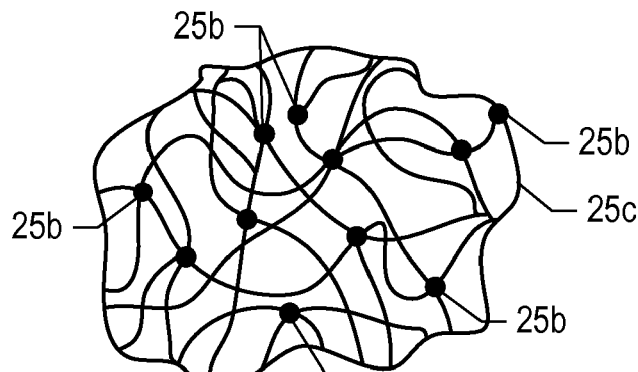
FIG. 3 is a simplified representation of cross-linked polymer material into which the material shown in FIG. 2 is transformed after being subjected to radiation.

Referring to FIGS. 1, 2 and 3, after a desired distance "d" has been reached, radiation source 22 produces actinic radiation that polymerizes and cross-links material 25a, forming cross-linked polymer material 25c. As a result, the composition of imprinting layer 24 transforms from material 25a to material 25c, which is a solid. Specifically, material 25c is solidified to provide side 24c of imprinting layer 24 with a shape conforming to a shape of a surface 14a of mold 14, shown more clearly in FIG. 4.

Referring to FIGS. 1, 2 and 3 an exemplary radiation source 22 may produce ultraviolet radiation. Other radiation sources may be employed, such as thermal, electromagnetic and the like. The selection of radiation employed to initiate the polymerization of the material in imprinting layer 24 is known to one skilled in the art and typically depends on the specific application which is desired. After imprinting layer 24 is transformed to consist of material 25c, translation device 20 increases the distance "d" so that mold 14 and imprinting layer 24 are spaced-apart.

Referring to FIG. 4, additional processing may be employed to complete the patterning of substrate 10. For example, substrate 10 and imprinting layer 24 may be etched to increase the aspect ratio of recesses 30 in imprinting layer 24. To facilitate etching, the material from which imprinting layer 24 is formed may be varied to define a relative etch rate with respect to substrate 10, as desired. The relative etch rate of imprinting layer 24 to substrate 10 may be in a range of about 1.5:1 to about 100:1. Alternatively, or in addition to, imprinting layer 24 may be provided with an etch differential with respect to photo-resist material (not shown) selectively disposed on side 24c. The photo-resist material (not shown) may be provided to further pattern imprinting layer 24, using known techniques. Any etch process may be employed, dependent upon the etch rate desired and the underlying constituents that form substrate 10 and imprinting layer 24. Exemplary etch processes may include plasma etching, reactive ion etching, chemical wet etching and the like.

Figure 5:
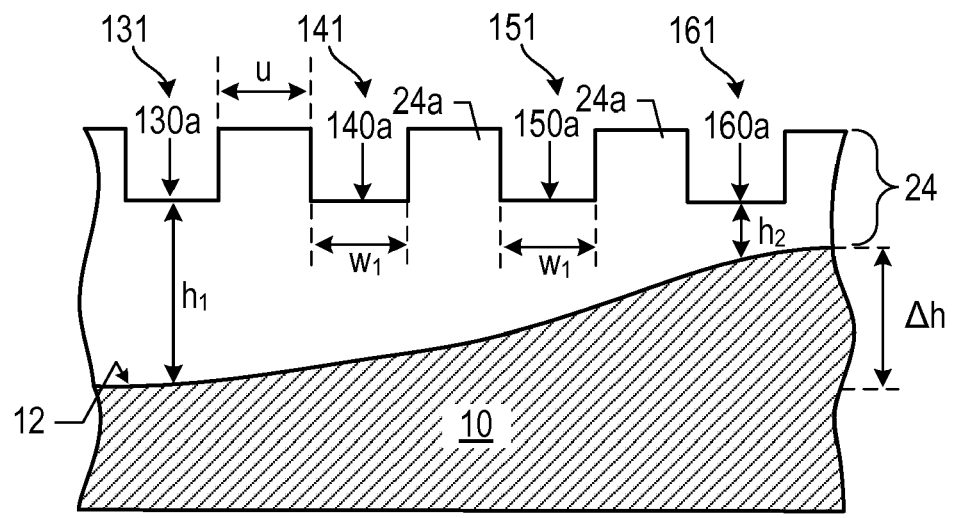
FIG. 5 is a detailed view of the imprinting layer shown in FIG. 4 demonstrating the non-planarity of substrate.

Referring to FIG. 5, a problem addressed by the present invention concerns formation of features on substrates having extreme topologies when compared to the dimensions of features formed thereon. As a result, substrate 10 appears to present a non-planar surface 12. This has been traditionally found in substrates formed from gallium arsenide (GAs) or indium phosphide (InP). However, as the feature dimensions decrease substrates that have historically been considered planar may present a non-planar surface to features formed thereon. For example, substrate 10 is shown with variations in surface height. The variation in height frustrates attempts to control the dimensions of features formed into substrate 10, because of the resulting differences in distances between nadirs 130a and 160a from surface 12, shown as $h_1$ and $h_2$, respectively. The height differential, $\Delta h$, between surface nadir 130a and nadir 160a is defined as follows:

$$\Delta h = |h_1 - h_2| \quad (1)$$

Height differential, $\Delta h$, results in differing etch characteristics of vias formed into substrate 10, discussed more fully below with respect to FIGS. 6 and 7.

Figure 6:
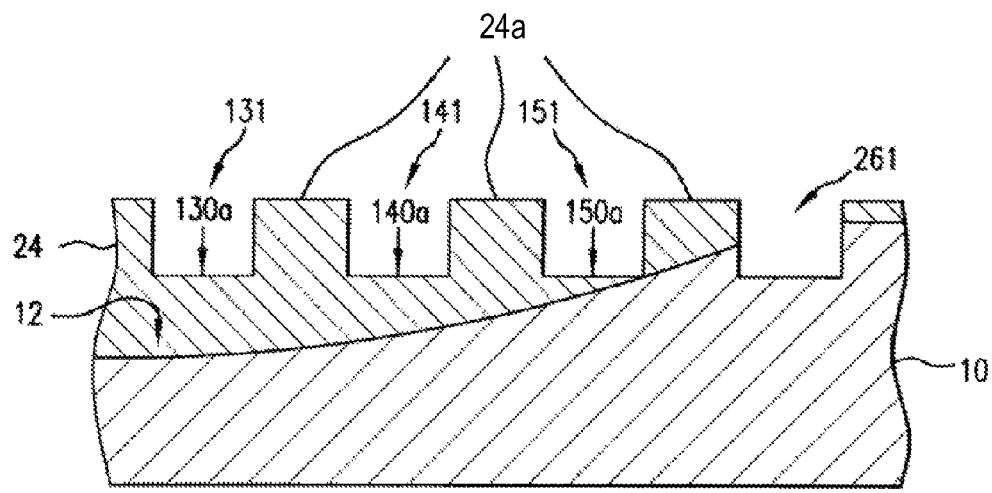
FIG. 6 is a detailed view of the imprinting layer shown in FIG. 5 showing the transfer of the features in the imprinting layer into the substrate during an etching process.
Figure 7:
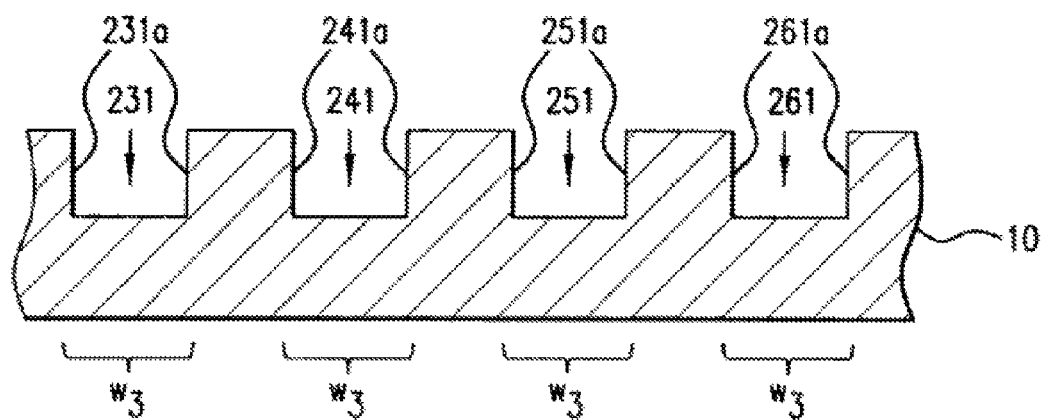
FIG. 7 is a detailed view of the substrate shown in FIG. 6 after completion of the etch process that transfers features of the imprinting layer into the substrate.

Referring to FIGS. 5, 6 and 7, transfer of the features, such as recesses 131, 141, 151, 161 and sub-portions 24a, in imprinting layer 24 into substrate 10 occurs through etch processes. The height differential, $\Delta h$, results during formation of via 261 in substrate 10 before formation of the remaining vias, which will be formed in regions of substrate 10 in superimposition with recesses 131, 141 and 151. This results from the time during which substrate 10 is etched during formation of vias. Specifically, nadir 160a reaches surface 12 of substrate 10 before the remaining nadirs 130a, 140a and 150a. As a result an etch differential occurs, i.e., the etch process to which substrate 10 is exposed to form vias therein differs over substrate surface 12. The etch differential is problematic, because it results in anisotropic etching that distorts the features transferred into substrate 10 from imprinting layer 24. The distortion presents, inter alia, by variations in width $w_3$ between vias 231, 241, 251 and 261 formed into substrate 10.

Ideally, the width of recesses 131, 141, 151 and 161, $w_1$, should be substantially similar to width $w_3$. However the height differential, $\Delta h$, results in $w_3$ of vias 251 and 261 being greater than $w_1$, as well as larger than $w_3$ of vias 231 and 241. The difference between the widths $w_3$ of vias 231, 241, 251 and 261 defines a differential width $\Delta w$. The greater the height differential, $\Delta h$, the greater the differential width $\Delta w$. As a result $\Delta w$ of via 231 and 261 is greater than $\Delta w$ of vias 231 and 251.

Referring to both FIGS. 4, 6, 7 and 8, to avoid these drawbacks, the present invention seeks to minimize the height differential $\Delta h$ by minimizing layer thickness $t_2$ and selecting a region of substrate 10 upon which to locate and define area, A, so as to maximize the planarity of area A. Optimized production yield favors maximization of area A. However, it was determined that the smaller area, A, is made, the greater the planarity of substrate surface 12 in area, A. In short, minimization of area, A, maximizes the planarity of the same. Thus, attempts to obtain large production yields, appears to be in conflict with maximizing the planarity of area, A, because maximizing the area A reduces the planarity of surface 12 associated with area, A.

The manufacture of metrology standards, however, does not require large yields. Therefore, in the present embodiment of the invention, the location and size of area, A, is chosen to maximize the planarity of surface 12 in area, A of surface 12 over which vias 231, 241, 251 and 261 are formed. It is believed that by appropriately selecting area, A, over which vias 231, 241, 251 and 261 are formed, it will be possible to deposit an imprinting layer 24 of sufficiently small thickness $t_2$ while minimizing height differential $\Delta h$, if not abrogating the height differential $\Delta h$ entirely. This provides greater control over the dimensions of recesses 131, 141, 151 and 161, that may be subsequently formed into imprinting layer 24, thereby affording the fabrication of features on the order of a few nanometers.

Figure 8:
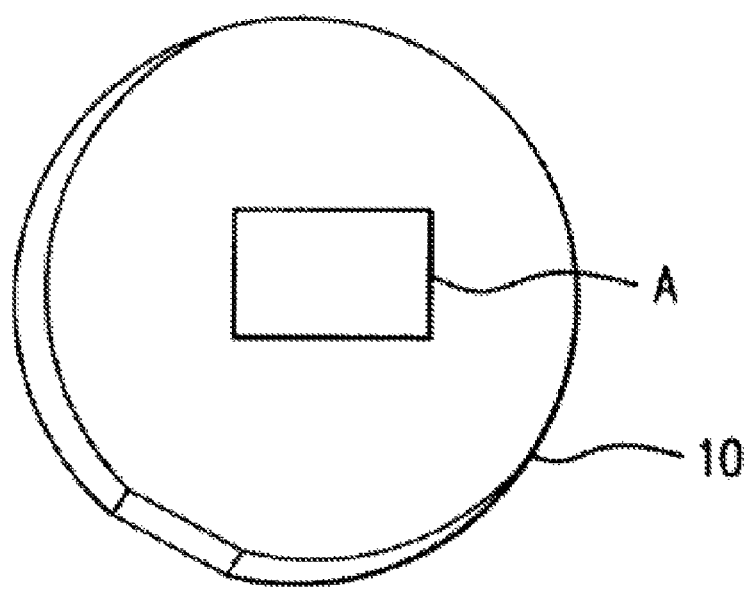
FIG. 8 is a perspective view of the substrate shown in FIGS. 1-7.
Figure 9:
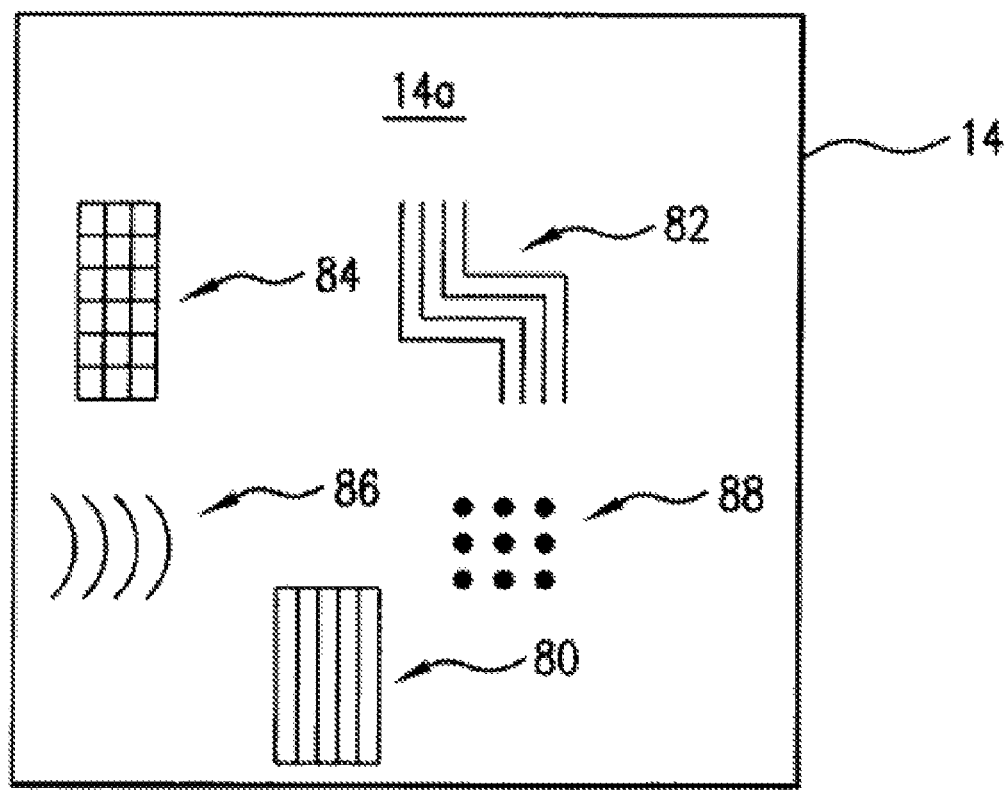
FIG. 9 is a detailed view of a mold shown in FIG. 1, in accordance with one embodiment of the present invention.

Referring to FIGS. 1, 4 and 8, to that end, the minimum layer thickness was chosen to avoid visco-elastic behavior of the liquid in beads 25. It is believed that visco-elastic behavior makes difficult controlling the imprinting process. For example, the visco-elastic behavior defines a minimum thickness that layer 24 may reach, after which fluid properties, such as flow, cease. This may present by bulges in nadirs 130a, 140a, 150a and 160a as well as other problematic characteristics. In the present embodiment it was determined that providing imprinting layer 24 with a minimum thickness $t_2$ of no less than approximately 10 nanometers satisfied this criteria, i.e., it was the minimum thickness that could be achieved while preventing imprinting layer 24 from demonstrating visco-elastic behavior. Assuming a uniform thickness, $t_2$, over layer 24, e.g., sub-portions 24a and recesses 131, 141, 151 and 161 not being present so that side 24c is planar it was determined that the volume of liquid in beads 25 may define the planarity of side 24d that forms an interface with surface 12 and is disposed opposite to side 24c. The volume is typically selected to maximize the planarity of side 24d, which forms an interface with surface 12. With a priori knowledge of the topology of surface 12, the size and locus of area, A, may be chosen to maximize planarity over area A. Knowing A and the desired layer thickness $t_2$, the volume, V, may be derived from the following relationship:

$$V = At_2 \tag{2}$$

However, with the presence of features, such as sub-portions 24a and recesses 131, 141, 151 and 161, results in layer 24 having a varying thickness over area, A. Thus, equation (2) is modified to take into consideration volumetric changes required due to the varying thickness of layer 24 over area, A. Specifically, the volume, V, is chosen so as to minimize thickness $t_2$, while avoiding visco-elastic behavior and providing the requisite quantity of liquid to include features, such as sub-portions 24a of thickness $t_1$, and recess 131, 141, 151 and 161 into layer 24. As a result, in accordance with this embodiment of the invention, the volume, V, of liquid in beads 25 may be defined as follows:

$$V = A(t_2 + ft_1) \tag{3}$$

where f is the fill factor and A, $t_2$ and $t_2$ are as defined above.

Referring to FIGS. 1, 4, 7, 8 and 9, further control of the dimensions of features formed into substrate 10 may be achieved by proper placement and selection of recessions 16 and protrusions 18 over surface 14a. Specifically, the arrangement of recessions 16 and protrusions 18 on mold 14 may be designed to define a uniform fill factor over mold surface 14a. As a result, the size of etch areas will be substantially equal to the size of non-etch areas of substrate 10 in area A, where features on mold surface 14a are imprinted. This arrangement of features reduces, if not avoids, variations in imprinting layer 24 thickness by minimizing pattern density variations. By avoiding thickness variations in imprinting layer 24, distortions caused by the transfer of features into substrate 10 during etch processes are reduced, if not avoided. Additional control can be obtained by having the recessions 16 and protrusions 18 formed to be periodic over surface 14a of mold 14. As a result, the features transferred to imprinting layer 24 and subsequently etched into area A, i.e., vias 231, 241, 251 and 261, fully populate and are periodic in area A.

It should be noted that mold surface 14a may be formed with uniform period features having common shapes, as well as having differing shapes, as shown. Further, recessions 16 and protrusions 18 may be arranged on mold 14 to form virtually any desired geometric pattern. Exemplary patterns include a series of linear grooves/projections 80, a series of L-Shaped grooves/projections 82, a series of intersecting grooves/projections defining a matrix 84, and a series of arcuate grooves/projections 86. Additionally, pillars 88 may project from mold 14 and have any cross-sectional shape desired, e.g., circular, polygonal etc.

Additionally, it is desired not to employ features as part of the metrology standards that are located proximate to the edge of imprinting layer 24 and, therefore, area A. These features become distorted when transferred into substrate 10 during etching. The distortion is produced by edge-effects due to micro-loading, thereby exacerbating control of the feature dimensions.

Referring to FIGS. 7 and 8, in another embodiment of the present invention, further control of formation of vias 231, 241, 251 and 261 may be achieved by orientating the lattice structure of substrate 10 to ensure that sidewalls 231a, 241a, 251a and 261a are orientated to be substantially parallel to one of the crystal planes of the material from which the substrate 10 is formed. For example, substrate 10 may be fabricated so that the sidewalls 231a, 241a, 251a and 261a extend parallel to either of the 100, 010 or the 110 planes. This facilitates more precise control of the width $w_3$ of vias 231, 241, 251 and 261 in furtherance of uniformity of the same among all features formed in area A, particularly when features of imprinting layer 24 are transferred into substrate 10 using wet etch chemistries.

Referring to FIG. 1 in accordance with another embodiment of the present invention, to further provide greater control of the feature dimensions in imprinting layers 24, it has been found that the force $\vec{F}$ applied by mold 14 should be deminimis and only sufficient magnitude to facilitate contact with beads 25. The spreading of liquid in beads 25 should be attributable primarily through capillary action with mold surface 14a.

Referring to FIGS. 1, 2 and 4, the characteristics of material 25a are important to efficiently pattern substrate 10 in light of the unique deposition process that is in accordance with the present invention. As mentioned above, material 25a is deposited on substrate 10 as a plurality of discrete and spaced-apart beads 25. The combined volume of beads 25 is such that the material 25a is distributed appropriately over area of surface 12 where imprinting layer 24 is to be formed. As a result, imprinting layer 24 is spread and patterned concurrently, with the pattern being subsequently set by exposure to radiation, such as ultraviolet radiation. It is desired, therefore, that material 25a has certain characteristics to facilitate even spreading of material 25a in beads 25 over surface 12 so that the all thicknesses $t_1$ are substantially uniform and all thickness $t_2$ are substantially uniform and all widths, $w_1$, are substantially uniform. The desirable characteristics include having a suitable viscosity to demonstrate satisfaction with these characteristics, as well as the ability to wet surface of substrate 10 and avoid subsequent pit or hole formation after polymerization. To that end, in one example, the wettability of imprinting layer 24, as defined by the contact angle method, should be such that the angle, $\Theta_1$, is defined as follows:

$$0 > \Theta_1 < 75° \tag{4}$$

With these two characteristics being satisfied, imprinting layer 24 may be made sufficiently thin while avoiding formation of pits or holes in the thinner regions of imprinting layer 24.

Referring to FIGS. 2, 3, 4 and 5, another desirable characteristic that it is desired for material 25a to possess is thermal stability such that the variation in an angle Φ, measured between a nadir 30a of a recess 30 and a sidewall 30b thereof, does not vary more than 10% after being heated to 75° C. for thirty (30) minutes. Additionally, material 25a should transform to material 25c, i.e., polymerize and cross-link, when subjected to a pulse of radiation containing less than 5 J cm$^{-2}$. In the present example, polymerization and cross-linking was determined by analyzing the infrared absorption of the "C═C" bond contained in material 25a. Additionally, it is desired that substrate surface 12 be relatively inert toward material 25a, such that less than 500 nm of surface 12 be dissolved as a result sixty (60) seconds of contact with material 25a. It is further desired that the wetting of mold 14 by imprinting layer 24 be minimized, i.e., wetting angle, $\Theta_2$, be should be of requisite magnitude. To that end, the wetting angle, $\Theta_2$, should be greater than 75°.

The constituent components that form material 25a to provide the aforementioned characteristics may differ. This results from substrate 10 being formed from a number of different materials. As a result, the chemical composition of surface 12 varies dependent upon the material from which substrate 10 is formed. For example, substrate 10 may be formed from silicon, plastics, gallium arsenide, mercury telluride, and composites thereof. Additionally, substrate 10 may include one or more layers in region, e.g., dielectric layer, metal layers, semiconductor layer and the like.

Referring to FIGS. 2 and 3, in one embodiment of the present invention, the constituent components of material 25a consist of acrylated monomers or methacrylated monomers that are not silyated, a cross-linking agent, and an initiator. The non-silyated acryl or methacryl monomers are selected to provide material 25a with a minimal viscosity, e.g., viscosity approximating the viscosity of water (1-2 cps) or less. However, it has been determined that the speed of imprinting may be sacrificed in favor of higher accuracy in feature dimensions. As a result, a much higher viscosity material may be employed. As a result the range of viscosity that may be employed is from 1 to 1,000 centipoise or greater. The cross-linking agent is included to cross-link the molecules of the non-silyated monomers, providing material 25a with the properties to record a pattern thereon having very small feature sizes, on the order of a few nanometers and to provide the aforementioned thermal stability for further processing. To that end, the initiator is provided to produce a free radical reaction in response to radiation, causing the non-silyated monomers and the cross-linking agent to polymerize and cross-link, forming a cross-linked polymer material 25c. In the present example, a photo-initiator responsive to ultraviolet radiation is employed. In addition, if desired, a silyated monomer may also be included in material 25a to control the etch rate of the resulting cross-linked polymer material 25c, without substantially affecting the viscosity of material 25a.

Examples of non-silyated monomers include, but are not limited to, butyl acrylate, methyl acrylate, methyl methacrylate, or mixtures thereof. The non-silyated monomer may make up approximately 25% to 60% by weight of material 25a. It is believed that the monomer provides adhesion to an underlying organic transfer layer, discussed more fully below.

The cross-linking agent is a monomer that includes two or more polymerizable groups. In one embodiment, polyfunctional siloxane derivatives may be used as a cross-linking agent. An example of a polyfunctional siloxane derivative is 1,3-bis(3-methacryloxypropyl)-tetramethyl disiloxane. Another suitable cross-linking agent consists of ethylene diol diacrylate. The cross-linking agent may be present in material 25a in amounts of up to 20% by weight, but is more typically present in an amount of 5% to 15% by weight.

The initiator may be any component that initiates a free radical reaction in response to radiation, produced by radiation source 22, shown in FIG. 1, impinging thereupon and being absorbed thereby. Suitable initiators may include, but are not limited to, photo-initiators such as 1-hydroxycyclohexyl phenyl ketone or phenylbis(2,4,6-trimethyl benzoyl) phosphine oxide. The initiator may be present in material 25a in amounts of up to 5% by weight, but is typically present in an amount of 1% to 4% by weight.

Were it desired to include silylated monomers in material 25a, suitable silylated monomers may include, but are not limited to, silyl-acryloxy and silyl methacryloxy derivatives. Specific examples are methacryloxypropyl tris(tri-methylsiloxy)silane and (3-acryloxypropyl)tris(tri-methoxysiloxy)-silane. Silylated monomers may be present in material 25a in amounts from 25% to 50% by weight. The curable liquid may also include a dimethyl siloxane derivative. Examples of dimethyl siloxane derivatives include, but are not limited to, (acryloxypropyl)methylsiloxane dimethylsiloxane copolymer.

Referring to both FIGS. 1 and 2, exemplary compositions for material 25a are as follows:

Composition 1 n-butyl acrylate+(3-acryloxypropyltristrimethylsiloxy)silane+1,3-bis(3-methacryloxypropyl)tetramethyldisiloxane Composition 2 t-n-butyl acrylate+(3-acryloxypropyltristrimethylsiloxy)silane+Ethylene diol diacrylate Composition 3 t-butyl acrylate+methacryloxypropylpentamethyldisiloxane+1,3-bis(3-methacryloxypropyl)tetramethyldisiloxane The above-identified compositions also include stabilizers that are well known in the chemical art to increase the operational life, as well as initiators. Further, to reduce distortions in the features of imprinting layer 24 due to shrinkage of material 25a during curing, e.g., exposure to actinic radiation such as ultraviolet radiation, silicon nano-balls may be added to the material 25a either before patterning, e.g., before application of beads 25 to surface 12, or after application of beads 25 to surface 12.

Referring to FIGS. 1, 2 and 3, additionally, to ensure that imprinting layer 24 does not adhere to mold 14, surface 14a may be treated with a modifying agent. One such modifying agent is a release layer (not shown) formed from a fluorocarbon silylating agent. The release layer and other surface modifying agents, may be applied using any known process. For example, processing techniques that may include chemical vapor deposition method, physical vapor deposition, atomic layer deposition or various other techniques, brazing and the like. In this configuration, imprinting layer 24 is located between substrate 10 and release layer (not shown), during imprint lithography processes.

Figure 10:
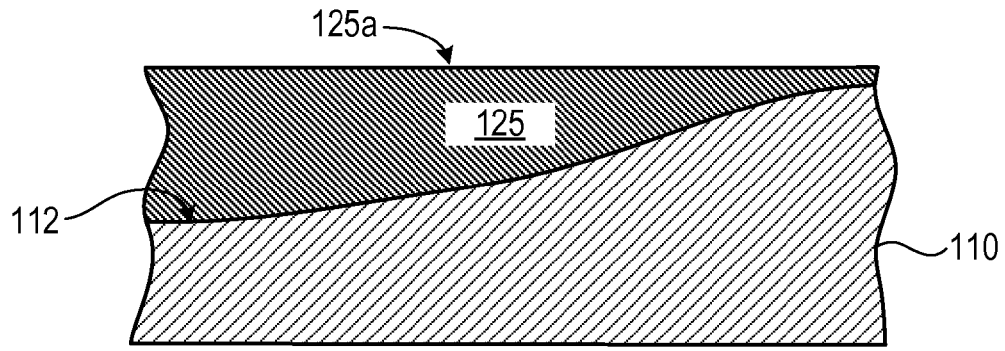
FIG. 10 is a detailed view of the imprinting layer shown in FIG. 4 using a planarization layer to overcome the non-planarity of the substrate, in accordance with a second embodiment of the present invention.

Referring to FIGS. 4 and 10, in some cases the non-planar topology of substrate 110 may frustrate deposition of an imprinting layer 24. This may be overcome by the use of a planarization layer 125. Planarization layer 125 functions to present a planar surface 125a to imprinting layer 124, shown more clearly in FIG. 11.

Figure 11:
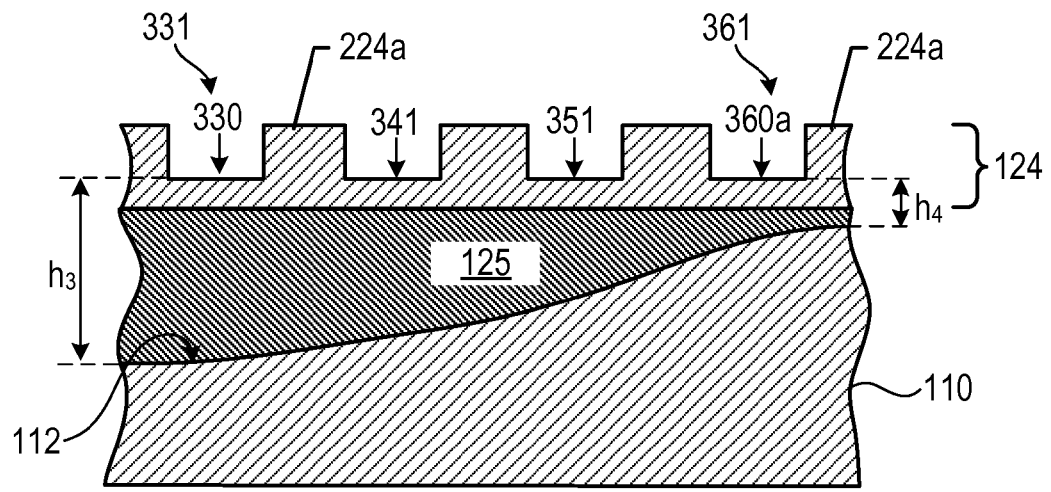
FIG. 11 is plan view of the substrate shown in FIG. 10, with a patterned imprinting layer being present.

Referring to both FIGS. 10 and 11, planarization layer 125 may be formed from a number of differing materials, such as, for example, thermoset polymers, thermoplastic polymers, polyepoxies, polyamides, polyurethanes, polycarbonates, polyesters, and combinations thereof. In the present example, planarization layer 125 is formed from an aromatic material so as to possess a continuous, smooth, relatively defect-free surface that may exhibit excellent adhesion to the imprinting layer 124. Specifically, surface 125a presents a planar region upon which imprinting layer 124 may be disposed and recesses 331, 341, 351 and 361 are formed.

Planarization layer 125 may be disposed on substrate 110 using any known deposition technique. In the present example, planarization layer 125 is disposed on substrate 110 using spin-on techniques. However, it was discovered that during etching, that the difference in height between nadirs 330a and 360a from surface 112, shown as $h_3$ and $h_4$, respectively, results in differing etch characteristics of vias formed into substrate 110, for the reasons discussed above. The height differential between surface nadir 330a and nadir 360a is defined as follows:

$$\Delta h' = |h_3 - h_4| \quad (5)$$

Figure 12:
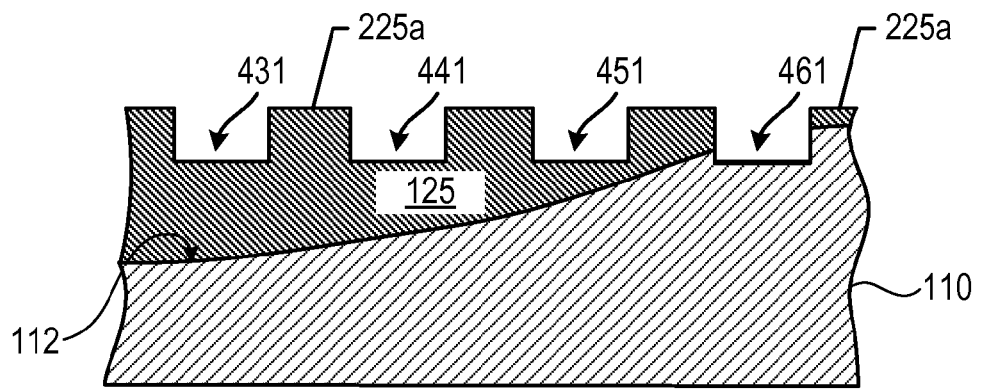
FIG. 12 is a plan view of the substrate shown in FIG. 11 after etching of the pattern into planarization layer.

Referring to both FIGS. 11 and 12, during the etching process, the features in imprinting layer 124, such as sub-portions 224a are transferred into both planarization layer 125 and substrate 110, forming sub-portions 225a. Spaced apart between sub-portions 225a are vias 431, 441, 451 and 461. Due to height differential $\Delta h'$ anisotropic etching occurs that distorts the features transferred into substrate 110 from imprinting layer 124, as discussed above. To avoid the problems presented by the height differential $\Delta h'$ the solutions described above may apply with equal weight here. An additional advantage with providing planarization layer 125 is that it may be formulated to compensate for the anisotropicity of the etch that occurs due to the height differential, $\Delta h$, defined by equation 1. As a result, planarization layer may be employed to reduce, if not overcome, the deleterious effects of the height differential, $\Delta h$, defined by equation 1.

The embodiments of the present invention described above are exemplary. Many changes and modifications may be made to the disclosure recited above, while remaining within the scope of the invention. For example, as mentioned above, many of the embodiments discussed above may be implemented in existing imprint lithography processes that do not employ formation of an imprinting layer by deposition of beads of polymerizable material. Exemplary processes in which differing embodiments of the present invention may be employed include a hot embossing process disclosed in U.S. Pat. No. 5,772,905; which is incorporated by reference in its entirety herein. Additionally, many of the embodiments of the present invention may be employed using a laser assisted direct imprinting (LADI) process of the type described by Chou et al. in *Ultrafast and Direct Imprint of Nanostructures in Silicon*, Nature, Col. 417, pp. 835-837, June 2002. Therefore, the scope of the invention should be determined not with reference to the above description, but instead should be determined with reference to the appended claims along with their full scope of equivalents.

What is claimed is:

1. A method for forming an imprinting layer on a substrate, the imprinting layer having a plurality of features and a residual layer, the method comprising:
    selecting a sub-portion of the substrate, the sub-portion having a locus and a size defining an area A;
    providing an imprint lithography template having a mold having substantially uniform period features;
    providing a plurality of discrete and spaced apart droplets of material in a pattern within the sub-portion of the substrate, the pattern of droplets distributing the material over the sub-portion of the substrate wherein imprinting layer is to be formed, the plurality of droplets having a combined volume determined by area A of the sub-portion, fill factor, desired thickness of the residual layer, and desired thickness of the features, such that the thickness of the residual layer is minimized and visco-elastic behavior of the material is minimized;
    contacting the imprint lithography template with the droplets spreading the droplets of material; and,
    solidifying the material forming the imprinting layer having the plurality of features and the residual layer.

2. The method of claim 1, further comprising etching the plurality of features into the substrate.

3. The method of claim 2, wherein the size of etch areas of the imprinting layer are substantially equal to size of non-etch areas of the imprinting layer.

4. The method of claim 1, wherein the uniform period features of the mold have substantially similar shapes.

5. The method of claim 1, wherein the uniform period features of the mold have differing shapes.

6. The method of claim 1, wherein the uniform period features are arranged on the mold forming a series of linear grooves.

7. The method of claim 1, wherein wettability of the imprinting layer is defined by a contact angle method such that angle $\Theta$ is substantially between 0 and 75 degrees.

8. The method of claim 1, wherein the plurality of features are at a set distance from an edge of imprinting layer.

9. A method, comprising:
    depositing a plurality of beads of liquid on a sub-portion of a substrate, with the plurality of beads having a volume associated therewith;
    contacting the plurality of beads with an imprint lithography template, the template having a mold with substantially uniform period features;
    spreading the beads over the sub-portion of the substrate to define a layer, the layer having a minimum thickness selected to reduce visco-elastic properties of the liquid in the layer; and,
    solidifying the layer forming an imprinting layer having a plurality of features and a residual layer.

10. The method of claim 9, wherein contacting the plurality of beads with the template facilitates spreading of the beads over the sub-portion through capillary action of the liquid.

11. The method of claim 9, wherein wettability of imprinting layer is defined by a contact angle method such that angle $\Theta$ is substantially between 0 and 75 degrees.

12. The method of claim 9, wherein the uniform period features of the mold have substantially similar shapes.

13. The method of claim 9, wherein the uniform period features of the mold have differing shapes.

14. The method of claim 9, wherein the uniform period features are arranged on the mold forming a series of linear grooves.

15. The method of claim 9, wherein the plurality of droplets have a combined volume determined by area A of the sub-portion, fill factor, desired thickness of the residual layer, and desired thickness of the features.

16. A method for forming an imprinting layer having a plurality of features and a residual layer, comprising:
    selecting a sub-portion of a substrate, the sub-portion having a locus and a size defining an area A;
    determining a combined volume of material based on area A of the sub-portion, fill factor, desired thickness of the residual layer, and desired thickness of the features depositing the combined volume of material as a plurality of beads on the sub-portion of the substrate;

contacting the plurality of beads with an imprint lithography template, the template having a mold with substantially uniform period features;

spreading the beads over the sub-portion of the substrate to define a layer, the layer having a minimum thickness selected to reduce visco-elastic properties of the liquid in the layer;

contacting the layer with an imprint lithography template, the template having a mold with substantially uniform period features; and, solidifying the layer forming an imprinting layer having a plurality of features and a residual layer.

17. The method of claim 16, wherein wettability of imprinting layer is defined by a contact angle method such that angle $\Theta$ is substantially between 0 and 75 degrees.

18. The method of claim 16, wherein the uniform period features of the mold have substantially similar shapes.

19. The method of claim 16, wherein the uniform period features of the mold have different shapes.

20. The method of claim 1, wherein the size and locus of area A is selected to maximize planarity over area A.

* * * * *